United States Patent
Ehlen et al.

(10) Patent No.: US 9,030,810 B2
(45) Date of Patent: May 12, 2015

(54) RACK STRUCTURE-MOUNTED POWER DISTRIBUTION UNIT

(71) Applicants: Jon Brian Ehlen, Milpitas, CA (US); Pierluigi Sarti, Milpitas, CA (US)

(72) Inventors: Jon Brian Ehlen, Milpitas, CA (US); Pierluigi Sarti, Milpitas, CA (US)

(73) Assignee: Facebook, Inc., Menlo Park, CA (US)

( * ) Notice: Subject to any disclaimer, the term of this patent is extended or adjusted under 35 U.S.C. 154(b) by 283 days.

(21) Appl. No.: 13/665,570

(22) Filed: Oct. 31, 2012

(65) Prior Publication Data
US 2014/0118886 A1    May 1, 2014

(51) Int. Cl.
*H05K 7/14* (2006.01)
*H02B 1/00* (2006.01)
*H02B 1/48* (2006.01)

(52) U.S. Cl.
CPC ......... *H05K 7/1432* (2013.01); *Y10T 29/49002* (2015.01); *H02B 1/48* (2013.01); *H05K 7/1492* (2013.01)

(58) Field of Classification Search
CPC ........... Y10T 29/49002; H05K 7/1432; H05K 7/1492; H02B 1/00; H02B 3/00; H02B 5/00; H02B 11/00; H02B 15/00
USPC ............... 361/600–727; 170/480–64; 211/26; 248/165
See application file for complete search history.

(56) References Cited

U.S. PATENT DOCUMENTS

| | | | |
|---|---|---|---|
| 6,229,691 B1 * | 5/2001 | Tanzer et al. | 361/622 |
| 6,769,551 B2 * | 8/2004 | Rafferty et al. | 211/26 |
| 7,275,947 B2 * | 10/2007 | Hartel et al. | 439/215 |
| 7,312,980 B2 * | 12/2007 | Ewing et al. | 361/622 |
| 8,066,535 B2 * | 11/2011 | Hsiao et al. | 439/719 |
| 8,400,765 B2 * | 3/2013 | Ross | 361/679.33 |
| 8,817,463 B1 * | 8/2014 | Rose et al. | 361/679.45 |
| 2003/0121689 A1 * | 7/2003 | Rasmussen et al. | 174/50 |
| 2005/0068716 A1 * | 3/2005 | Pereira | 361/624 |
| 2008/0093927 A1 * | 4/2008 | Ewing et al. | 307/23 |
| 2010/0110621 A1 * | 5/2010 | Dunn et al. | 361/679.01 |
| 2014/0027392 A1 * | 1/2014 | Crippen et al. | 211/26 |
| 2014/0070679 A1 * | 3/2014 | Liang | 312/223.1 |
| 2014/0085790 A1 * | 3/2014 | Fan et al. | 361/679.02 |

* cited by examiner

*Primary Examiner* — Zachary M Pape

(74) *Attorney, Agent, or Firm* — Fenwick & West LLP

(57) ABSTRACT

A power distribution unit (PDU) mounted within the structure of a rack. A mechanical interface secures the PDU to a portion of the rack structure, such as within a post of the rack. The PDU is configured to provide electrical power to computing assets mounted in the rack. Securing the PDU within the rack structure allows the PDU to be placed in an unobtrusive position that does not occupy space between the rack posts, increasing the space between the rack posts available for mounting computing assets.

11 Claims, 6 Drawing Sheets

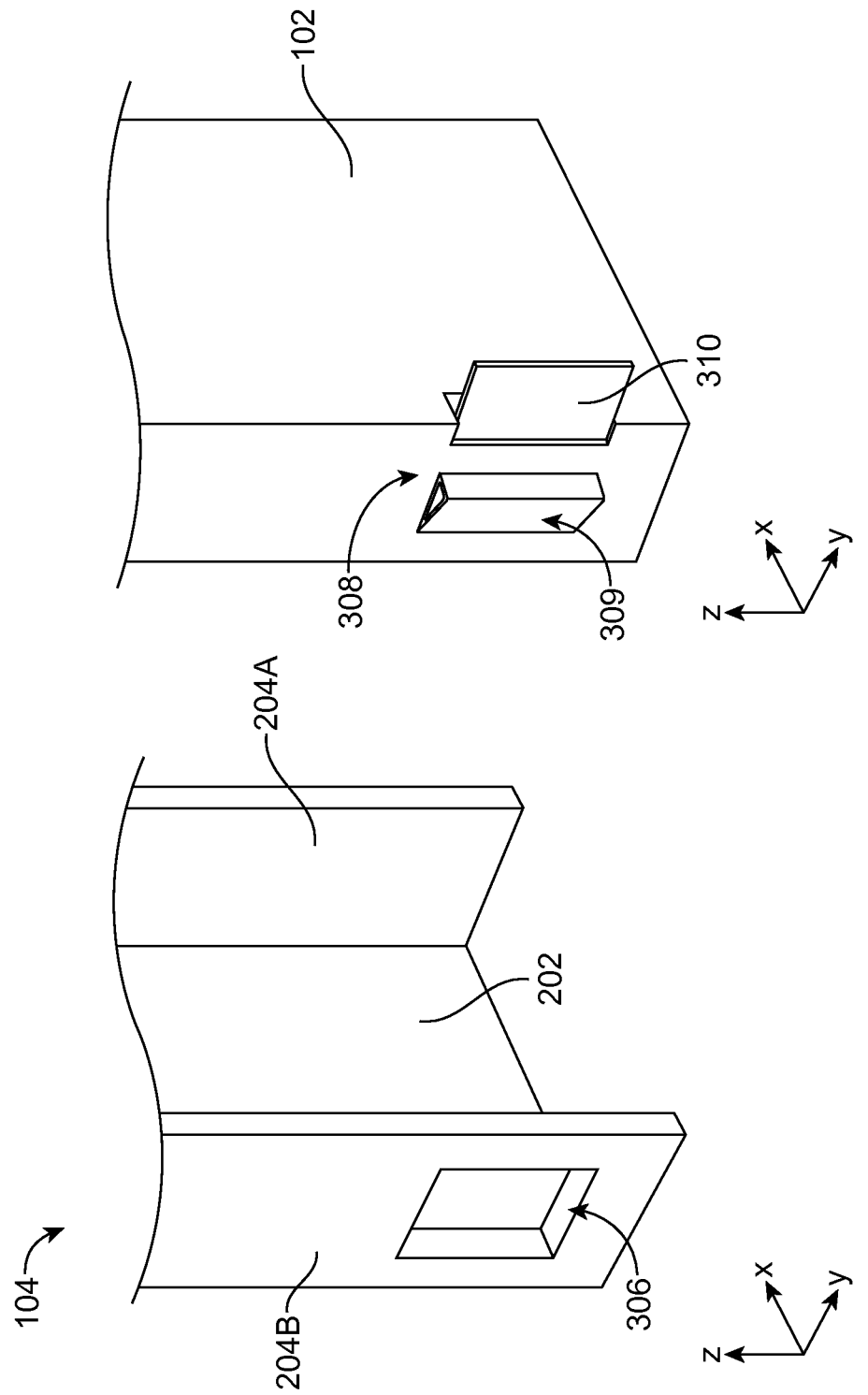

RACK STRUCTURE-MOUNTED POWER DISTRIBUTION UNIT

BACKGROUND

This invention relates generally to rack-mounted computing equipment, and in particular to mechanisms for mounting power distribution units to a rack.

Power distribution units (PDUs) are typically used to provide power to multiple servers and other devices mounted on a rack. Conventionally, a rack includes two or four vertical rack posts with rectangular cross sections. Conventionally, a PDU is vertically mounted to the outside of one of the rack posts, causing the PDU to protrude from the rest of the rack. Alternatively, a PDU with the same shape as a rack-mounted server is mounted in the area between the posts of the rack. However, mounting the PDU between the rack posts occupies space that could otherwise be used to house additional servers.

SUMMARY

Embodiments of the invention provide a power distribution unit (PDU) mounted within a rack structure. A mechanical interface secures the PDU within a portion of the rack structure. The PDU is connected so that it is configured to provide electrical power to computing assets mounted within the rack. Securing the PDU within the rack structure allows placement of the PDU so it does not occupy space exterior to the rack or space enclosed by the rack (e.g., space between posts of the rack structure). This increases the space within the rack in which computing assets may be mounted.

In one embodiment, the mechanical interface securing the PDU within the portion of the rack structure includes a drop-in mechanism and a quick-release mechanism. The drop-in mechanism includes a bridge lance coupled to the PDU and a retaining tab included on the rack post. The quick-release mechanism includes a latching mechanism integrated into the PDU and a rectangular slot on the rack post. To secure the PDU to the rack post, the retaining tab is inserted into the bridge lance, and the PDU is oriented to be parallel to one or more sides of the rack post. The latching mechanism is inserted into the rectangular slot to couple the quick-release mechanism and further secure the PDU to the rack post.

In one embodiment, a rectangular rack post has an opening on one side so that the post forms a C-channel, and the PDU is secured inside the C-channel using the mechanical interface. Hence, the rack post encloses the PDU on three sides, and the PDU occupies space within the rack post that would otherwise be void.

BRIEF DESCRIPTION OF THE DRAWINGS

FIGS. 3C-3D are perspective views of a quick-release mechanism on the rack post and the power distribution unit, according to one embodiment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1:
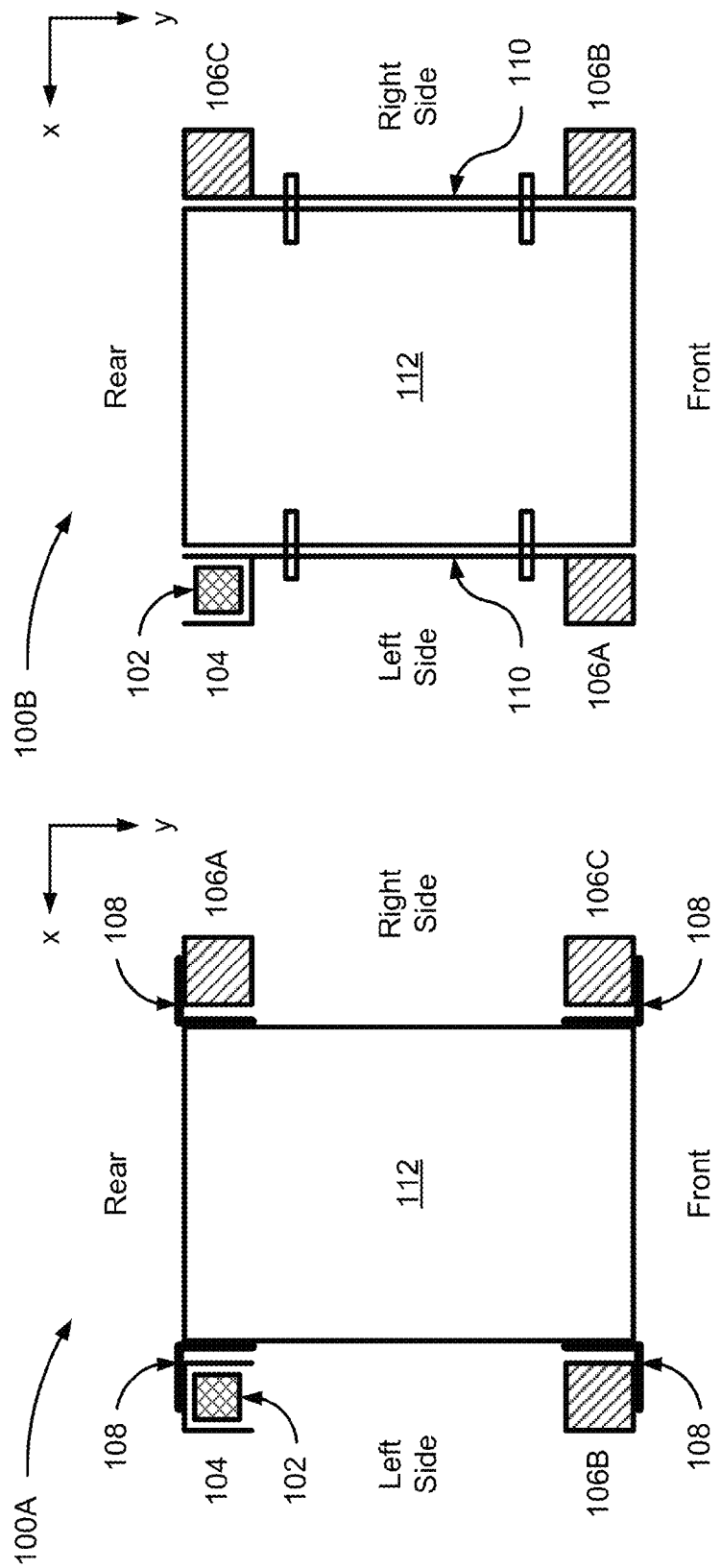
FIG. 1A is a top-down view of a power distribution unit mounted in the structure of a rack, according to one embodiment.
FIG. 1B is a top-down view of a power distribution unit mounted in the structure of a rack, according to another embodiment.

A power distribution unit ("PDU") is mounted within the structure of a rack so that the PDU does not protrude outward or occupy rack space otherwise useable to house computing assets. FIGS. 1A-1B illustrate top-down views of two example server racks 100A, 100B. In FIGS. 1A and 1B, the server racks 100A, 100B are illustrated with respect to a set of three axes that are used consistently throughout the figures to show orientation of the views in the figures relative to each other. In addition to the x- and y-axes that are shown, FIGS. 1A and 1B also include a z-axis (not pictured) that is oriented upward in a direction perpendicular to the plane of the page.

In the server racks 100A, 100B illustrated in FIGS. 1A and 1B, a PDU 102 is secured within the structure of an open rack post 104. The open rack post 104 has an opening on a side so that the open rack post 104 has the shape of a C-channel, which allows a user to access to the interior volume of the rack post 104 to install and remove the PDU 102. The example server racks 100A, 100B also include three closed rack posts 106A, 106B, 106C that provide additional mounting support for computing assets 112. The closed rack posts 106A, 106B, 106C have rectangular cross sections, and the interior volume of these posts 106A, 106B, 106C is inaccessible.

In the embodiment shown in FIG. 1A, a computing asset 112 is mounted to the open rack post 104 and to the closed rack posts 106A, 106B, 106C using four mounting brackets 108. One side of each mounting bracket 108 is fastened to a side of the computing asset 112, and a different side of each mounting bracket 108 is fastened to an exterior surface of a the open rack post 104 or to an exterior surface of the closed rack posts 106A, 106B, 106C. Hence, the side of the open rack post 104 having the opening may face the interior of the server rack 100A, as shown in FIG. 1A or may face the side of the server rack 100A. However, when using mounting brackets 108, it is difficult to orient the open rack post 104 so that the side of the open rack post 104 having the opening faces the front or rear of the rack 100A because the mounting brackets 108 are fastened to the front and rear faces of the rack posts.

In the embodiment shown in FIG. 1B, the computing asset 112 is mounted to the server rack 100B using a pair of side panels 110, further described in U.S. patent application Ser. No. 13/657,602, filed on Oct. 22, 2012, which is incorporated by reference herein in its entirety. Without using mounting brackets 108 to secure the computing asset 112 to the server rack 100B, the side of the open rack post 104 having the opening may face the interior, sides, front, or rear of the rack 100B. In the example shown in FIG. 1B, the opening of the open rack post 104 faces the rear of the rack 100B.

The PDU 102 is any device that distributes electrical power to one or more computing assets 112. In one embodiment, the PDU 102 receives power from a power distribution line (e.g., via a wall outlet) and includes outlets or other connectors for coupling the computing assets 112 to the power distribution line. The PDU 102 may also include circuitry to convert received power into a form more suitable for the computing assets 112. For example, the PDU 102 includes a transformer and/or a switched-mode power converter. In the illustrated embodiments, the PDU 102 has an elongated shape allowing it to fit vertically within the structure of the open rack post 104. However, in other embodiments, the PDU 102 may have a different shape allowing it to be differently oriented within another structural component of a server rack 100.

The computing asset 112 is any device using electrical power provided by the PDU 102. For example, a computing asset 112 is a server running services for a plurality of computing devices connected over a network. Alternatively, a computing asset 112 may be a personal computer, a network-attached storage system (NAS), networking equipment (e.g., a router, hub, or switch), or some other electronic device. As FIGS. 1A and 1B are top-down views of the server racks 100A, 100B, a single computing asset 112 is visible in each figure. However, the server racks 100A, 100B are typically configured so that multiple computing assets 112 may be mounted on top of each other in the space between the open rack post 104 and the closed rack posts 106A, 106B, 106C.

In alternative embodiments, the server racks 100A, 100B may include additional open rack posts 104 and fewer closed rack posts 106. For example, a server rack 100 includes two closed rack posts 106 and two open rack posts 104, or four open rack posts 104 and no closed rack posts 106. In other alternative embodiments, the open rack posts 104 may have a different cross-sectional shape that encloses or substantially closes the PDU. For example, the open rack post 104 may be an I-beam, with the PDU secured against the central portion of the I-beam (known as the web) so that it is substantially enclosed by the side portions (known as the flanges). In additional embodiments, the server rack 100 includes additional or fewer rack posts, which may be arranged differently. For example, a server rack 100 includes two rack posts, with computing assets 112 mounted to the rack posts near the front panels of the computing assets or near the middle of the computing assets 112.

Figure 2:
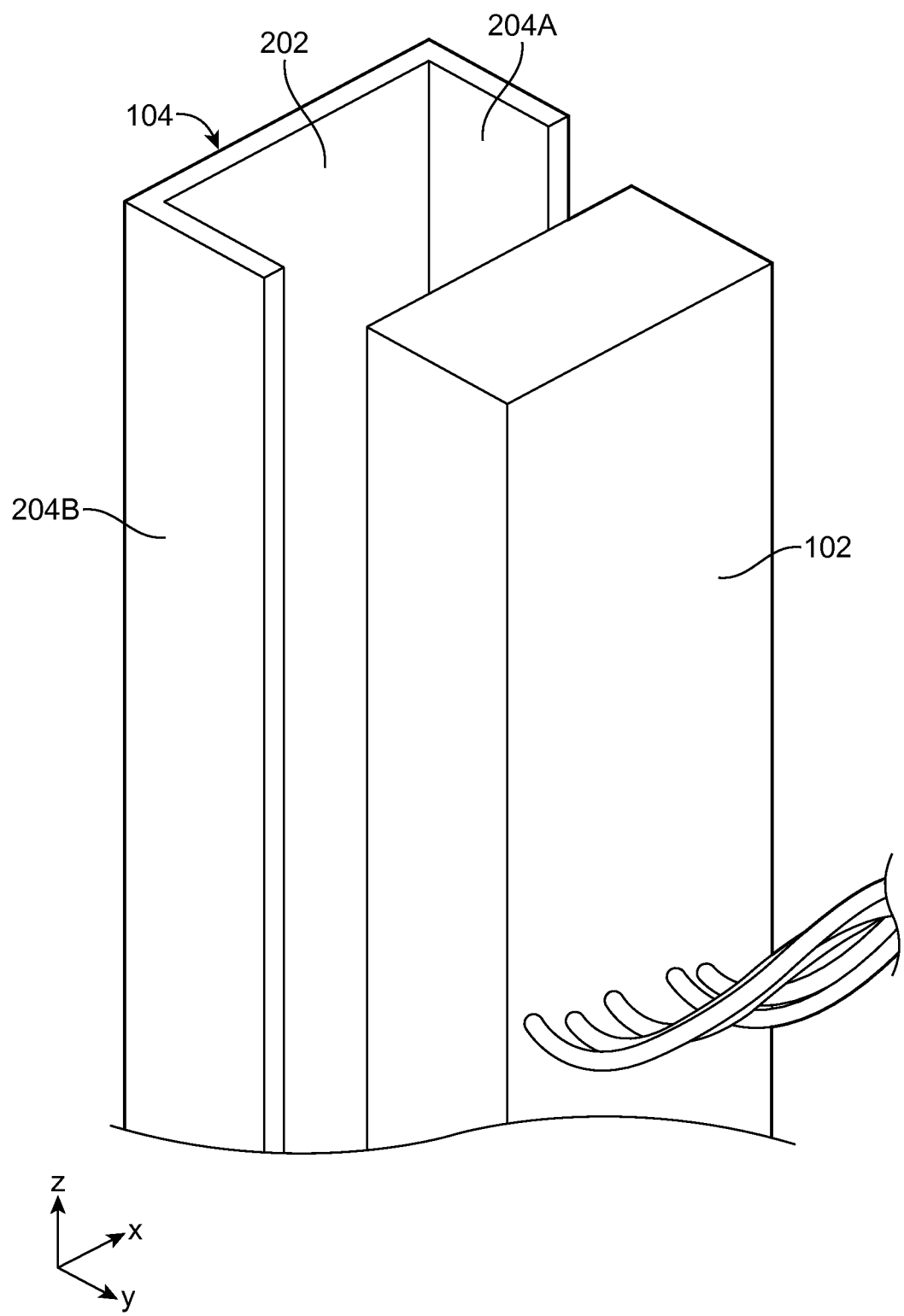
FIG. 2 is a perspective view of a power distribution unit parallel to an open rack post, according to one embodiment.

FIG. 2 is a perspective view of one embodiment of a power distribution unit 102 parallel to an open rack post 104. As shown in FIG. 2, the open rack post 104 has a back wall 202 and two side walls 204A, 204B. In one embodiment, the back wall 202 and/or side walls 204A, 204B include holes for fastening mounting brackets 108 and/or side panels 110 to the open rack post 104. A mechanical interface (not shown in FIG. 2) positioned on the open rack post 104 and surfaces of the PDU 102 secures the PDU 102 within the structure of the open rack post 104 so the side walls at least partially enclose the PDU 102. An example mechanical interface is described below with reference to FIGS. 3A-3D.

Figure 3B:
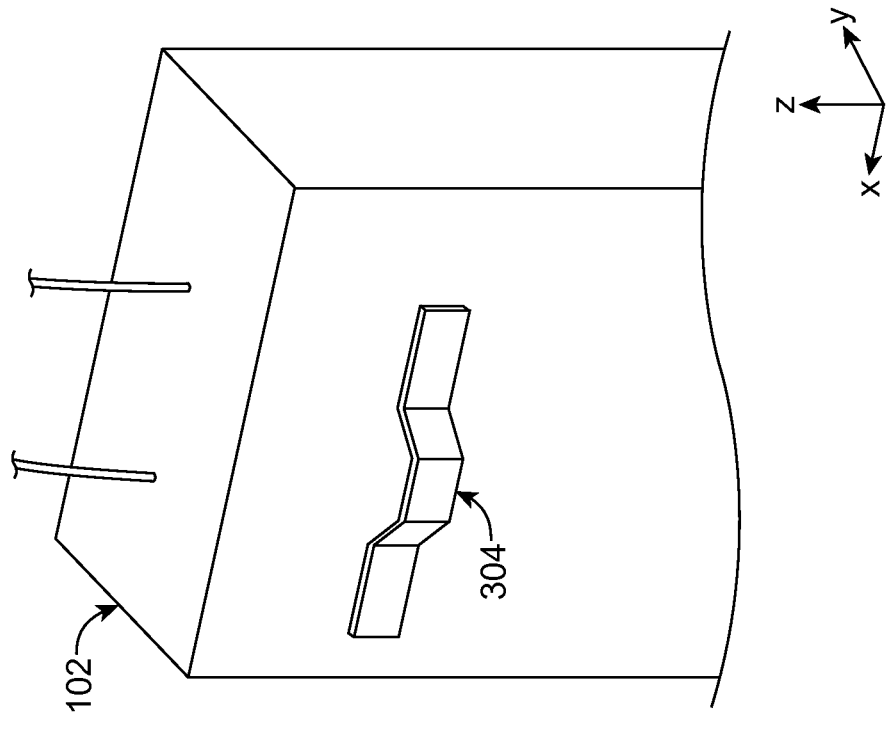
FIGS. 3A-3B are perspective views of a drop-in mechanism on the rack post and the power distribution unit, according to one embodiment.
Figure 3A:
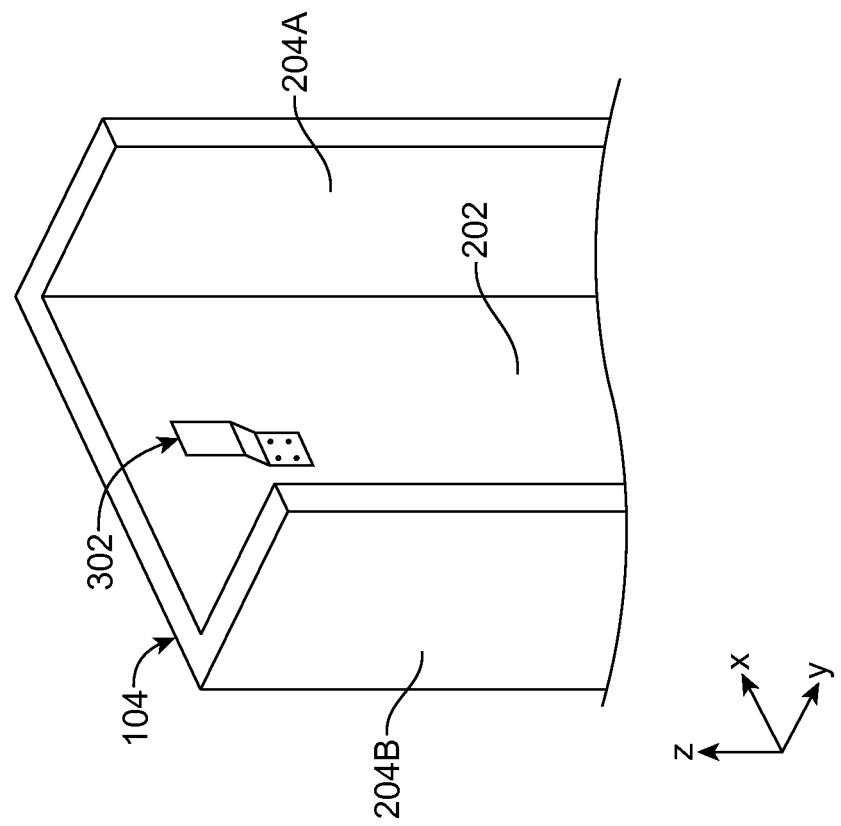

FIGS. 3A and 3B illustrate components of a drop-in mechanism that forms part of the mechanical interface between the PDU 102 and the open rack post 104. In the embodiment illustrated in FIGS. 3A and 3B, the drop-in mechanism includes a retaining tab 302 secured to a back wall 202 of the open rack post 104 and a bridge lance 304 secured to a corresponding face of the PDU 102. For example, the bridge lance 304 is secured on the face of the PDU near the top of the PDU 102. The retaining tab 302 is oriented vertically with an open end facing upward and a closed end fastened to the back wall 202. Meanwhile, the bridge lance 304 is oriented horizontally with an elevated center portion and two sides fastened to the face of the PDU 102. The drop-in mechanism is engaged by lowering the PDU 102 onto the retaining tab 302 so that the elevated portion of the bridge lance 304 slides under the retaining tab 302. In an alternative embodiment, the bridge lance 304 is secured to the back wall 202 of the open rack post 104 and the retaining tab 302 is secured near an upper end of the PDU 102. In this embodiment, the open end of the retaining tab 302 on the PDU 108 faces downward (i.e., upside-down relative to the orientation shown in FIG. 3A), so the retaining tab 302 is inserted into the bridge lance 304 by lowering the PDU 102.

FIGS. 3C and 3D illustrate components of a quick-release mechanism comprising an additional component of the mechanical interface between the PDU 102 and the open rack post 104. The quick-release mechanism includes a rectangular slot 306 on the side wall 204B of the open rack post 104 and a latching mechanism 308 integrated into a lower side surface of the PDU 102. The latching mechanism 308 is a mechanical fastener configured to couple to the rectangular slot 306 when the lower end of the PDU is pressed into the open rack post 104. In the illustrated embodiment, the latching mechanism 308 includes a protruding portion 309 and a release tab 310. The latching mechanism 308 also includes a spring (not shown in FIG. 3D) that pushes protruding portion 309 outward (in the negative x-direction) from the side of the PDU 102 to engage with the rectangular slot 306 when the PDU 102 is pushed into the open rack post 104. The release tab 310 is mechanically coupled to the protruding portion 309 so that the protruding portion 309 moves into the PDU 102 in the positive x-direction (against the force of the spring) when the release tab 310 is pushed in the positive x-direction. Hence, the release tab 310 provides a surface that can be pushed to compress the spring and easily disengage the protruding portion 309 from the rectangular slot 306. In one embodiment, the protruding portion 309 and the release tab 310 are part of a single strip of rigid sheet metal. Alternatively, the protruding portion 309 and the release tab 310 may be two discrete components mechanically coupled to each other.

Figure 4A:
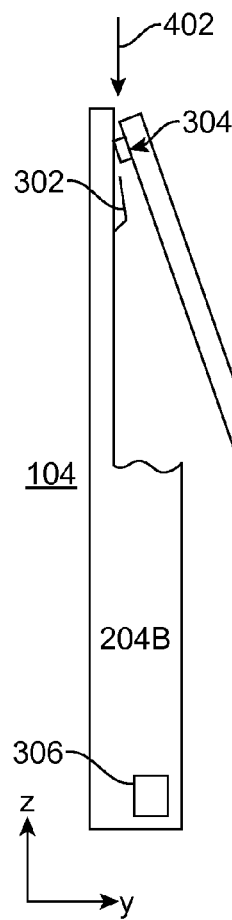
FIGS. 4A-4C illustrate a process for securing the power distribution unit to a rack post, according to one embodiment.
Figure 4B:
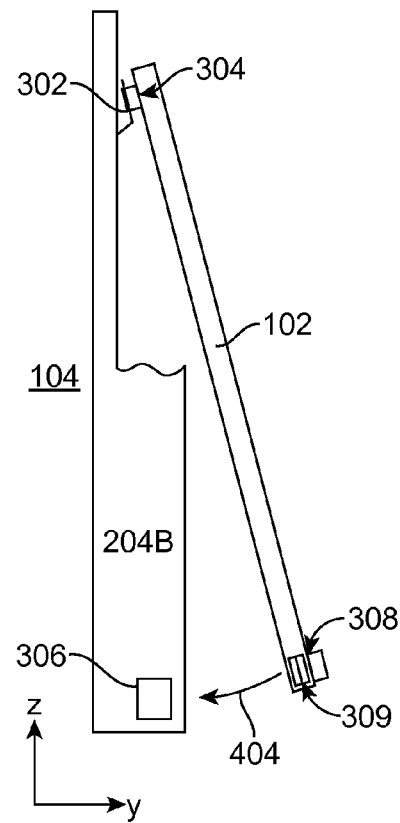
Figure 4C:
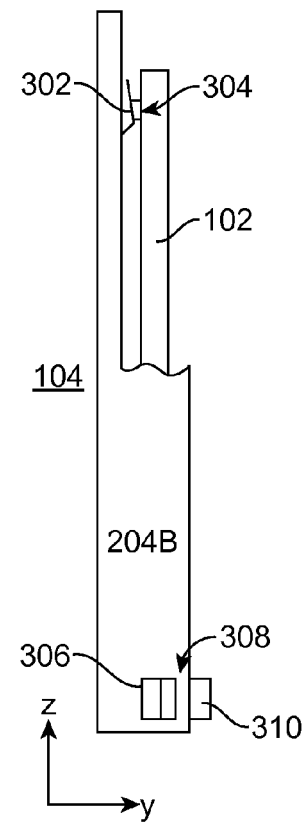

A mechanical interface including the drop-in mechanism and the quick-release mechanism described above with reference to FIGS. 3A-3D beneficially allows for tool-less installation and removal of the PDU 102. FIGS. 4A-4C show an example process for installing a PDU 102 in an open rack post 104 using this type of mechanical interface. For purposes of illustration, the side wall 204A and the upper portion of the side wall 204B are not shown in FIGS. 4A-4C. The installation process begins by lowering 402 the PDU 102 within the open rack post 104 so the bridge lance 304 slides under the retaining tab 302, as shown in FIG. 4A. Engaging the drop-in mechanism pins the PDU 102 so the top of the PDU 102 cannot move away from the open rack post 106 (i.e., in the positive y-direction shown by FIG. 4A).

The quick-release mechanism is coupled by rotating 404 the PDU 102 about the engaged drop-in mechanism to insert the protruding portion 306 of the latching mechanism 308 into the rectangular slot 306, as shown in FIG. 4B. In one embodiment, the quick-release mechanism is coupled after the PDU 102 is rotated 404 into a position substantially parallel with the rear surface and/or side surfaces of the open rack post 104. As described above with reference to FIGS. 3C and 3D, the rectangular slot 306 holds the latching mechanism 308 in place after the latching mechanism 308 is inserted into the rectangular slot 306.

Figure 4D:
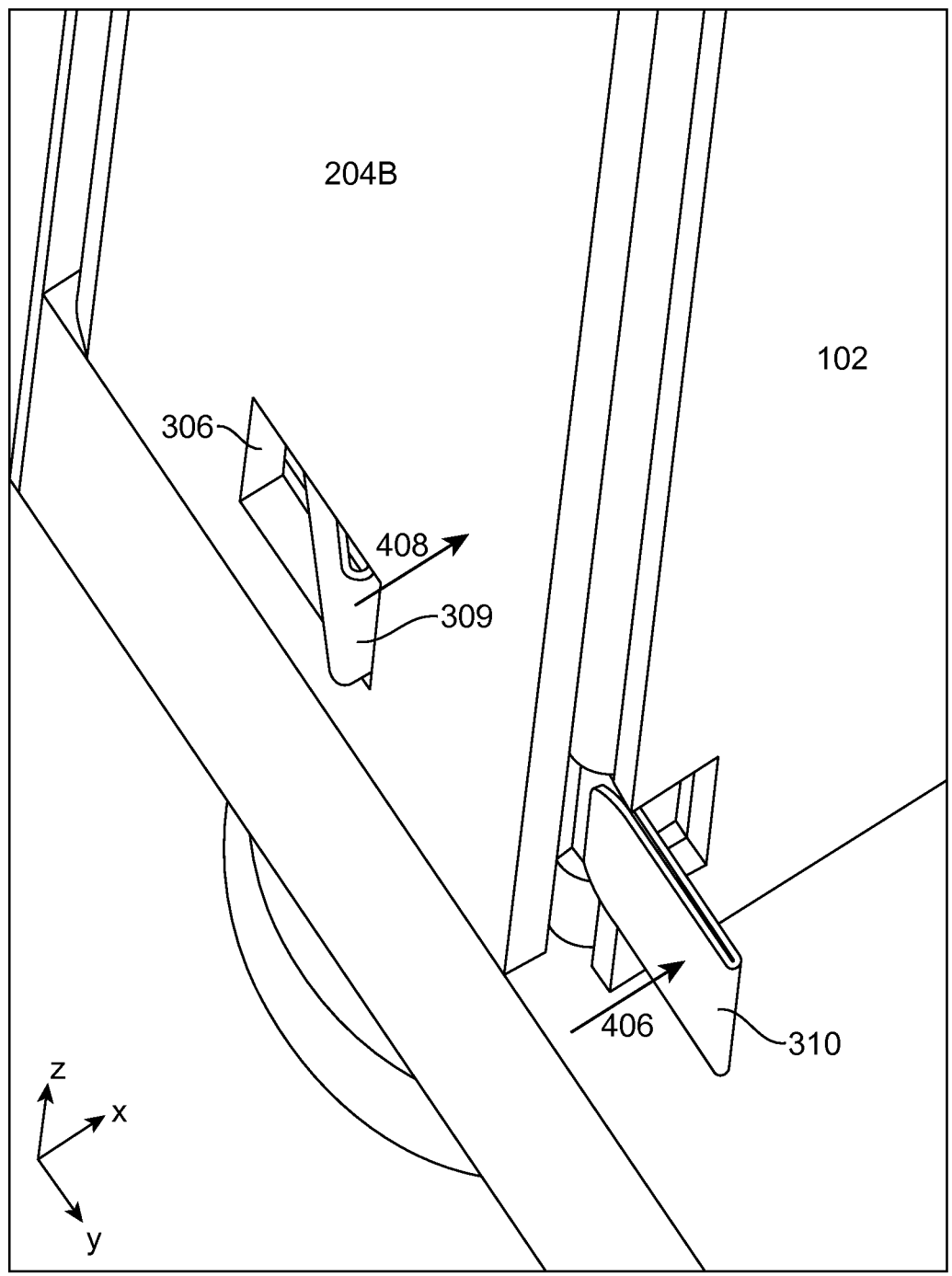
FIG. 4D illustrates a process for decoupling the quick-release mechanism, according to one embodiment.

After the quick-release mechanism is coupled, as shown in FIG. 4C, the PDU 102 is secured to the open rack post 104. The drop-in mechanism secures a top end of the PDU 102 to prevent the PDU 102 from tipping over, and the quick-release mechanism prevents the PDU 102 from moving outward or upward to disengage the drop-in mechanism. In one embodiment, the components of the mechanical interface on the open rack post 104 (e.g., the retaining tab 302 and the slam latch 306) are positioned so that the bottom of the PDU 102 rests on a surface (e.g., the floor or a bottom structure of the rack 100, as shown in FIG. 4D). This reduces the load carried by the mechanical interface, allowing use of small components of the mechanical interface, which may also reduce costs.

To remove the PDU 102, the steps are performed in reverse. The quick-release device is decoupled by pressing 406 the release tab 310 in the positive x-direction, as shown in FIG. 4D. As described above with reference to FIG. 3D, the release tab 310 is mechanically coupled to the protruding portion 309 of the latching mechanism 308 so that the protruding portion 309 moves 408 into the PDU 102 when the release tab 310 is pressed. As a result, the protruding portion 309 disengages from the rectangular slot 306, thus decoupling the quick-release mechanism and allowing the bottom of the PDU 102 to move relative to the open rack post 104. After disengaging the quick-release device, the PDU 102 is lifted upward to decouple the drop-in mechanism (e.g., by sliding the bridge lance 304 upward until it is no longer under the retaining tab 302). When the drop-in mechanism is decoupled, the PDU 102 may be pulled outward and away from the rack post 106.

As used herein, a PDU is contained within a rack if a substantial volume of the PDU (e.g., 70%, 80%, 90%, 95%, 98%, 100%, or some other percentage of the PDU's volume) occupies space in the structure of the rack. The structure of the rack includes any structural members, such as posts, beams, and panels, providing mechanical support to the computing assets mounted in the rack. In the embodiments described above, the PDU is positioned so that it occupies space within the structure of a rack post. However, in other embodiments, the PDU may be positioned so that it occupies space within a different structural member of the rack or within several different structural members of the rack. For example, the PDU may be positioned so that it occupies space within a beam along the top or bottom of the rack structure.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system comprising:
    a power distribution unit for providing electrical power to a plurality of computing assets, the power distribution unit configured to be oriented vertically;
    a rack for holding the plurality of rack-mounted computing assets therein, the rack including a post oriented vertically in the rack;
    a drop-in mechanism for coupling a first end of the power distribution unit to the post; and
    a quick-release mechanism for coupling a second end of the power distribution unit to the post, the quick release mechanism securing the power distribution unit to the post within the rack,
wherein the quick-release mechanism comprises a latching mechanism integrated into the second end of the power distribution unit.

2. The system of claim 1, wherein the drop-in mechanism comprises a bridge lance secured to the first end of the power distribution unit.

3. The system of claim 2, wherein the drop-in mechanism further comprises a retaining tab secured to the post, the bridge lance configured to be coupled to the retaining tab.

4. The system of claim 1, wherein the quick-release mechanism further comprises a rectangular slot in the post, the latching mechanism configured to be coupled to the rectangular slot.

5. The system of claim 1, wherein the post has a channel shape that encloses the power distribution unit on three sides.

6. The system of claim 1, wherein at least one of the computing assets is a server.

7. A method comprising:
    coupling a first end of a power distribution unit to a post of a rack using a drop-in mechanism, the rack for holding a plurality of rack-mounted computing assets;
    rotating the power distribution unit into a position substantially parallel to the post; and
    engaging a quick-release mechanism to couple a second end of the power distribution unit to the post, the quick-release mechanism securing the power distribution unit to the post within the rack.

8. The method of claim 7, wherein coupling the first end of the power distribution unit comprises coupling a bridge lance secured to the first end of the power distribution unit to a retaining tab secured to the post.

9. The method of claim 7, wherein engaging the quick-release mechanism attached to the post comprises coupling a latching mechanism integrated into the second end of the power distribution unit to a rectangular slot in the post.

10. The method of claim 7, wherein the post has a channel shape that encloses the power distribution unit on three sides.

11. The method of claim 7, wherein at least one of the computing assets is a server.

* * * * *